(12) United States Patent
Peng et al.

(10) Patent No.: US 7,939,824 B2
(45) Date of Patent: May 10, 2011

(54) TEST STRUCTURE

(75) Inventors: Ta-Chih Peng, Hsinchu (TW); Yu-Ting Lin, Hsin-Chu (TW); Liang-Chen Lin, Hsinchu County (TW); Ko-Yi Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 12/354,338

(22) Filed: Jan. 15, 2009

(65) Prior Publication Data

US 2009/0121222 A1 May 14, 2009

Related U.S. Application Data

(62) Division of application No. 11/634,588, filed on Dec. 6, 2006, now Pat. No. 7,498,680.

(51) Int. Cl.
H01L 23/58 (2006.01)
H01L 29/10 (2006.01)
(52) U.S. Cl. ............... 257/48; 257/780; 257/E23.02
(58) Field of Classification Search ............ 257/48, 257/780, E23.02
See application file for complete search history.

(56) References Cited

U.S. PATENT DOCUMENTS

| 7,301,231 B2 | 11/2007 | Antol et al. |
| 2004/0217487 A1 | 11/2004 | Low et al. |
| 2005/0121804 A1 | 6/2005 | Kuo et al. |
| 2008/0083992 A1* | 4/2008 | Lin et al. ............... 257/774 |

* cited by examiner

Primary Examiner — Phat X Cao
(74) Attorney, Agent, or Firm — Slater & Matsil, L.L.P.

(57) ABSTRACT

A test structure to detect vertical leakage in a multi-layer flip chip pad stack or similar semiconductor device. The test structure is integrated into the semiconductor device when it is fabricated. A metal layer includes at least two portions that are electrically isolated from each other; one portion being disposed under a test pad, and another portion being disposed under a pad associated with a pad structure being tested. The metal layer in most cases is separated from a top metal layer directly underlying the pads by an inter-metal dielectric (IMD) layer. A metal layer portion underlying the pad to be tested forms a recess in which a conductive member is disposed without making electrical contact. The conductive line is electrically coupled to a test portion of the same or, alternately, of a different metal layer. The test structure may be implemented on multiple layers, with recesses portions underlying the same or different pads.

19 Claims, 10 Drawing Sheets

TEST STRUCTURE

This application is a divisional of patent application Ser. No. 11/634,588, entitled "Test Structure," filed on Dec. 6, 2006, now U.S. Pat. No. 7,498,680 which application is incorporated herein by reference.

TECHNICAL FIELD

The present invention relates generally to a field of semiconductor devices, and relates more particularly to a test structure for detecting vertical shorts in a multi-layer semiconductor device associated with a pad for making external connections.

BACKGROUND

Generally, semiconductor chips are small pieces of silicon or a similarly-suitable material on which a large number of interconnected electrical devices have been fabricated to form integrated circuits. The circuits are capable of performing a variety of tasks, such as the computations necessary to the operation of personal computers, mobile telephones, and digital cameras. The devices making up the integrated circuits are very small, and there are typically a great number of them on a single chip, which is often less than a square centimeter in area and very thin. Usually, a thin slice of substrate material called a wafer is used as a base for fabricating many chips at the same time, using a number of process steps. The individual chips are then separated from each other and packaged for installation into the appliance for which they are intended.

On any wafer, and therefore on any one chip it contains, there are sometimes many layers of different materials that are added to the wafer substrate and shaped to form the individual devices. Electrical devices may be, and usually are formed on any level, and each device often occupies more than one layer. As might be expected, both conductive and insulating layers are required. Conductive layers may be largely devoted to interconnects (usually metal) that couple electrical devices to one another, or to other interconnects.

The integrated circuits formed on the chip require external connections to be useful. An external connection may used for operation, or testing, or both, and usually consists of a bond pad or similar structure. One example is illustrated in FIG. 1. FIG. 1 is an elevation, or side view illustrating in cross-section an exemplary semiconductor device 100. Semiconductor device 100 is formed on a substrate 115, in this example a silicon wafer (only a small portion of which is shown). A number of separate devices have been formed on the surface 116 of the substrate 115, and are in FIG. 1 referred to as devices 121 through 124. These devices may be, for example, transistors, capacitors, or diodes, although other types of devices are possible. The devices are connected in various ways to form electrical circuits that enable the overall device 100 to perform its intended function. Note that although four devices are shown for the purpose of illustration, in most modern applications, there are thousands, if not millions of such devices. And while devices 121 through 124 are formed on the surface 116 of substrate 115, these may in some cases be formed on an appropriately-prepared higher layer as well. In the example of FIG. 1, the active devices 121 though 124 and any other proximate and connected devices (not shown) are referred to for convenience as an active area 120.

Active area 120, and possibly some of the individual devices constituting it, are connected to other active areas, active devices, or to an external component. Such connections are often accomplished using an interconnect of some kind. In FIG. 1, via 126 and via 127 are recesses formed in a layer 125 of dielectric material and filled with a conductor such as copper to establish a vertical electrical connection. Vias 126 and 127 are in contact with the active area 120 at their lower end and with conducting lines 31 and 32 at their upper end. Lines 31 and 32, and typically many other conductors like them on the same vertical level, are often formed at the same time at part of a metal layer 130. The separate conductive elements of metal layer 130, which may or may not be in contact with each other, may be formed in a number of ways such as selectively etching away unneeded portions of the a layer of conductive material that was previously-formed on top of dielectric layer 125.

Note that for convenience the spatial designations such as "top" or "above" refer to the orientation shown in FIG. 1 (and other Figures). This is generally though not necessarily the orientation of the device as it is being fabricated, and components are generally though not necessarily formed from the bottom to the top. In operation, of course, a typical device may be used in almost any orientation.

The necessary external connection referred to above is provided, in the example of FIG. 1, by pad 105. Pad 105 is located at a level near the top surface of semiconductor device 100. Here, it is actually disposed within an opening formed through a passivation layer 175, and may be one of several hundred such pads. As should be apparent, the pad 105 is relatively large compared to the active devices 121 through 124. This is typical, though FIG. 1 is not intended to be drawn to scale. The pad's relatively-large size is often necessary for the pad to be used for its intended purpose.

Pad 105 may be used in a number of different ways, for example as a connection point for a bond wire or solder ball (in which cases it might be referred to as a bond pad or a bump pad, respectively). It may also be used as a contact point for a small probe, which is not permanently installed but simply placed in contact with pad 105 for running an electrical test. In the configuration of FIG. 1, the pad 105 is located laterally at a (relatively) significant distance from the active area 120. This is not atypical; in many applications the active areas are formed in the center of the chip and the pads are grouped together around the chip periphery. The pad 105 is connected to the active area 120, or other areas with which it is associated, by one or more lines of metal or other conductive material. Because there are so many connections to be made, these lines must be routed in ways that avoid unwanted intersections. To accomplish this, several metal layers are frequently used, with each layer separated from the adjacent ones by a layer of insulating material. Vias, which are basically vertical connectors, are used to connect lines at different levels. Many connections pass through a number of lines and vias. A line and its associated vias may be referred to an interconnect.

The example of FIG. 1 includes a number of layers to generally illustrate how these interconnects may be arranged. Atop the dielectric layer 125 and metal layer 130, whose top surfaces are not atypically coplanar, is an inter-metal dielectric (IMD) layer 135 and a metal layer 140. As should be apparent, the metal layers are not uniform and solid, but rather form a pattern of conductive elements that are disposed at substantially the same level. Elements in metal layer 140 may be connected to elements in metal layer 130 by one or more vias, as is generally illustrated in FIG. 1. In some instances, however, an undesirable electrical connection, that is, a short circuit, may be caused by a defect in the pad structure. Because they connect two or more vertically-disposed layers, these are sometimes referred to as "vertical shorts". Despite their relatively-large size compared with other semiconductor devices, the pads are nevertheless fairly small and fragile, and damage to them or the underlying layers can be caused by simply by application of a test probe or by attachment of a bond wire or solder ball. Since such damage may be hidden under the pad, it may be difficult to detect.

Inspection for such defects may be made through "deprocessing", where the layers previously-deposited on the wafer surface are removed, one by one, with the device being examined between each removal. Not only is this a destructive inspection, however, but it is both time-consuming and subject to be inaccurate. At any given removal step, too much material may be removed and a formed defect lost, or artifacts may remain and the view of a defect obstructed. What is needed, then, is a manner of electrically testing the pad structure to more easily and reliably detect any vertical shorts. The present invention provides just such a solution.

SUMMARY OF THE INVENTION

These and other problems are generally solved or circumvented, and technical advantages are generally achieved, by illustrative embodiments of the present invention that are directed to a test structure for integration into a semiconductor device and to a semiconductor device with an incorporated test structure.

In one aspect, the present invention is a semiconductor device having an integrated test structure, including an active area formed on a substrate and an externally accessible pad disposed over the active area but separated from it by a plurality of metal layers, the metal layers being separated from each other by respective inter-metal (IMD) dielectric layers, wherein the test structure includes a test pad, a test portion of one of the plurality of metal layers, and a conductive member extending from the test portion into a recess formed in another portion of one of the plurality of metal layers, wherein the test portion and the other portion are electrically-isolated from each other and preferably though not necessarily portions of the same metal layer. The semiconductor device may further include additional test portions from which conductive members extend, and these additional test portions may be on the same or different layers.

In another aspect, the present invention is a test structure for integrating into a semiconductor device, including a test portion underlying a test pad and a conductive member extending from the test portion into a recess formed in another metal portion underlying a second pad, wherein the test portion and the other metal portion are integrated as electrically-isolated elements of one or more metal layers in a semiconductor device. In an alternative embodiment, a plurality of conductive elements extends from the test portion into recesses formed in other metal portions.

An advantage of an illustrative embodiment of the present invention is that vertical shorts formed in a pad structure, for example by wire bonding or test probe application, may be detected efficiently and without the need for time-consuming and destructive testing such as deprocessing.

A further advantage of an illustrative embodiment of the present invention is that the test structure may be integrated into a semiconductor without any, or very few, additional process steps so that the fabrication process is not delayed.

As more complete appreciation of the present invention and the scope thereof can be obtained from the accompanying drawings that are briefly summarized below, the following detailed description of the—illustrative embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a pad structure for a circuit-under-pad (CUP) flip-chip device. The invention may also be applied, however, to other semiconductor devices as well.

The present invention is directed to a test structure for use in semiconductor devices. The test structure of the present invention is intended to be integrated into the device, that is, it becomes a part of the semiconductor device itself. Note that the components of the test structure may or may not have other functions with regard to the device into which it is incorporated. Note also that when the device is tested, for example using a current versus voltage (IV) test, external testing equipment may also be used. This external equipment is not considered a part of the test structure of the present invention, however, which is limited to the components actually integrated into the device itself unless explicitly recited otherwise.

Figure 1:
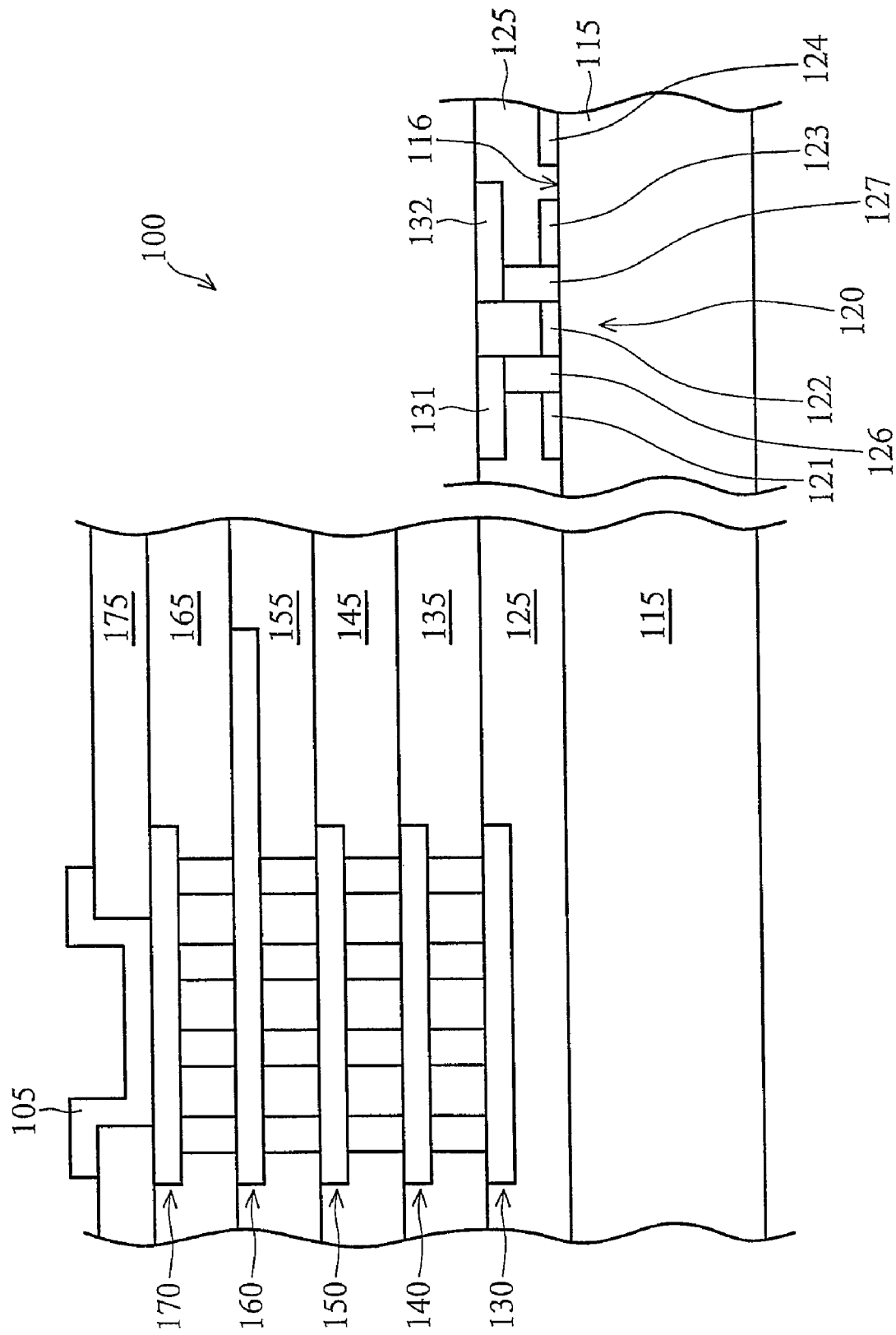
FIG. 1 is an elevation, or side view illustrating in cross-section an exemplary semiconductor device.
Figure 2:
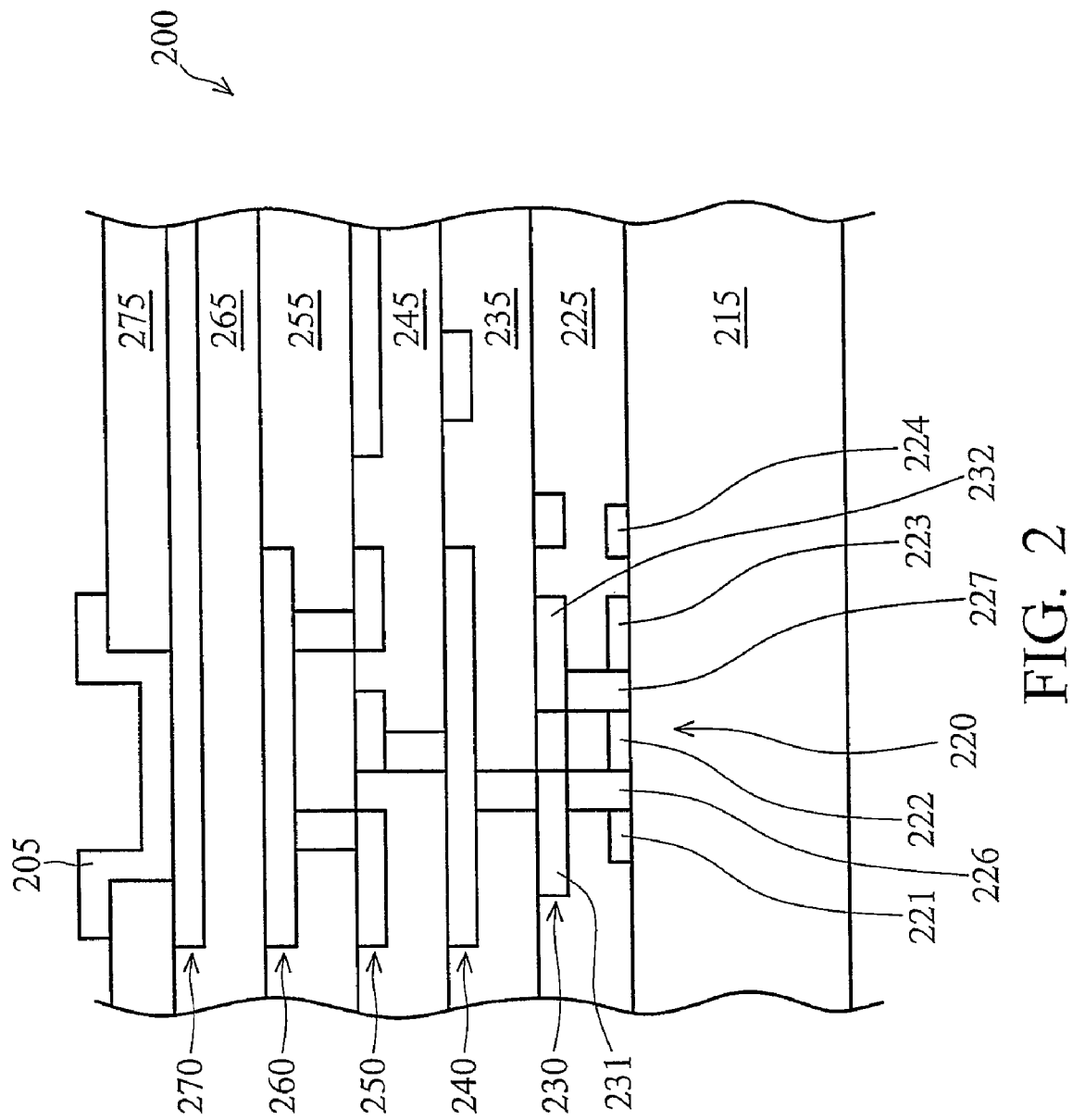
FIG. 2 is a side view illustrating in cross-section an exemplary flip chip semiconductor device.

Certain types of semiconductor devices may benefit significantly from integration of embodiments of the present invention, for example the flip-chip CUP configuration illustrated in FIG. 2. FIG. 2 is a side view illustrating in cross-section an exemplary flip chip semiconductor device 200. Note that, while different from the structure of FIG. 1, many parts of the semiconductor device 200 of FIG. 2 are analogous, and where possible will for convenience be numbered analogously. A pad 205 is formed atop the device 200, as illustrated in FIG. 2, within a recess formed in passivation layer 275. As semiconductor device 200 is (part of) a flip chip, pad 205 may be a bump pad, to which a solder ball is attached to make connections to a carrier device (not shown). Beneath the passivation layer 275 is a metal layer sometimes referred to as a redistribution layer (RDL) because it maps connections from the chip to the bump pads such as pad 205. Here, this layer will simply be referred to as a top metal layer, the top metal layer being the metal layer closest to the pad. Top metal layer 270 at its top surface is coplanar with a first IMD layer 265, in which the top metal layer elements are in this example embedded. Beneath IMD layer 265 is a second metal layer 260, whose top surface is coplanar with the top surface of second IMD layer 255.

Note that the convention being used herein, which is solely for convenience in describing the present invention, may differ from conventions used elsewhere. In this disclosure, the top metal layer is under (and usually though not necessarily adjacent to) a pad or pads, and is electrically isolated underneath by a first IMD layer, except to the extent that connections through the IMD are intentionally established, such as through a conductor-filled via. Under the first IMD layer is the second metal layer and the second IMD layer, and so forth. Accordingly, beneath the second IMD layer 255 is a third metal layer 250 and a third IMD layer 245, followed by a fourth metal layer 240 and a fourth IMD layer 235 and, finally, a fifth metal layer 230, the top of which is coplanar with the top of a dielectric layer 225. Connections between elements of one metal layer and elements of another are made with vias containing a conductive material. This is generally illustrated in FIG. 2, although the vias are not separately enumerated.

Dielectric layer 225 is disposed over substrate 215 and the devices 221 through 224 that are formed thereon. The devices are shown for illustration, and normally there are a great many more on a chip. In the example of FIG. 2, devices 221 through 224 form an active area 220. Note that active area 220 is more or less directly underneath pad 205. This configuration, known as circuit under pad (CUP) is often favored because it makes efficient use of the available chip area and generally enables the inclusion of many more devices that the configuration of, for example, semiconductor device 100 shown in FIG. 1. Unfortunately, as mentioned above, the CUP configuration may also make it more difficult to detect vertical shorts.

The test structure of the present invention provides an efficient and reliable means for determining whether a vertical short, or current leakage path, is present in the stack of metal layers associated with an external connection pad. A specific result or level of improvement is not, however, a requirement of the invention unless specifically recited. As mentioned above, the vertical short, if present, may be the result of damage to an IMD layer caused by circuit probe application, wire bonding, or solder ball installation. Other factors, for example a fabrication defect, may also cause vertical shorts. Discovery the presence of vertical shorts enables the manufacturer to use other, perhaps redundant, pads for external connection, or to discard the chip entirely. In some applications, the chip is simply a vehicle for testing new fabrication methods or procedures, and the detection of vertical shorts may be used to improve those methods and procedures.

Figure 3:
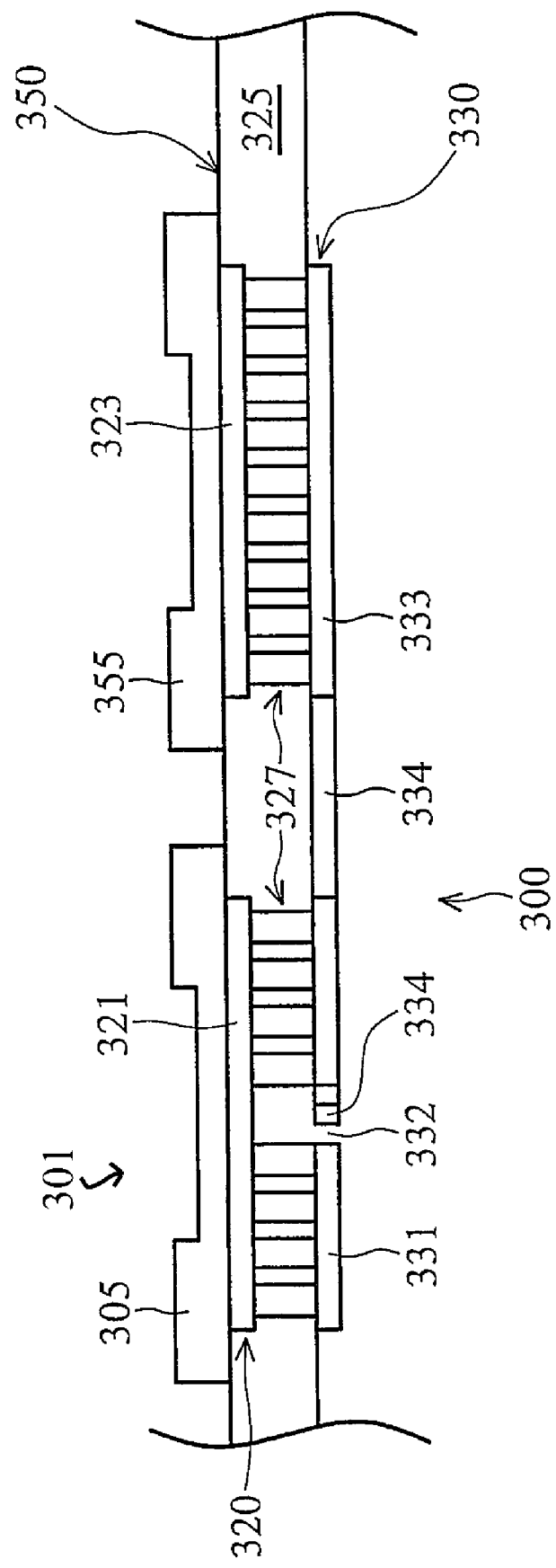
FIG. 3 is a side view of a semiconductor device illustrating in cross-section the integration of a test structure according to an embodiment of the present invention.

FIG. 3 is a side view of a semiconductor device 300 illustrating in cross-section the integration of a test structure according to an embodiment of the presentation. Note that the term 'semiconductor device' is being used herein to refer both to a fully or partially fabricated semiconductor chip and to an individual component or collection of components on the chip. Therefore when the term is used, for example in the claims, it is considered to include the recited component part or parts, but does not imply the presence of others unless apparent from the context. Note also that in FIG. 3 only the upper layers are shown, though the invention will generally be applied in devices having multiple layers such as those shown in FIGS. 1 and 2. The lower layers, and the substrate and active areas are omitted simply because they are unnecessary to the explanation. As should be apparent, however, the present invention is not limited to use with the configurations of FIGS. 1 and 2.

Returning to the embodiment of FIG. 3, test structure 350 has been integrated into semiconductor device 300. Semiconductor device 300 includes a device under test (DUT) 301. DUT 301 includes a pad 305, which may be a probing, wire-bond, or bump pad, or be intended for some similar function. The term 'pad' will be used herein to describe all of these types of components. Pad 305 is a conductor, usually a metal such as aluminum or copper, and provides an accessible point of connected for electrically coupling an external device with the component parts to which the pad 305 itself is actually coupled. Pad 305 may be formed within an opening in a passivation layer, similar to pad 205 in FIG. 2, though the a passivation layer is for simplicity not included in the embodiment of FIG. 3.

Similarly, test pad 355 may be formed in a separate passivation-layer opening, which is also not shown in FIG. 3. Test pad 355 will be used when a (current-voltage) IV test or some other test is actually performed for detecting vertical leakage using the test structure 350 integrated into semiconductor device 300. Underlying, and in contact with or at least coupled to pad 305 and test pad 355, is top metal layer 320. As should be apparent, top metal layer 320 in this embodiment lies immediately beneath the pads and provides the first connection from the pads to the other chip components. As mentioned above, in a flip-chip application the top metal layer may be an RDL, which is sometimes used to map a chip's wire-bond type layout to an area-array flip-chip layer to which solder ball (bump) connections maybe made through the pads.

In accordance with this embodiment of the present invention, metal layer 320 in semiconductor device 300 is divided into two electronically-isolated portions. A first portion 321 underlies pad 305 and a test portion 323 underlies test pad 355. Note that metal layer 320 typically forms a great many portions, some of which underlie other pads (not shown) and some of which may perform other functions. Under top metal layer 320 is a second metal layer 330, which is separated from top metal layer 320 by a first IMD layer 325. Any electrical connections required between top metal layer 320 and second metal layer 330 are, in this embodiment, made through one or more conductor-filled vias, which in FIG. 3 are collectively referred to as 327. Note that the individual vias of via set 327 shown in FIG. 3 may couple various elements present in the respective metal layers.

In the embodiment of FIG. 3, the second metal layer 330 is separated into two portions that are electrically isolated with respect to each other. A first portion 331 of the second metal layer 330 is disposed beneath pad 305 and the first portion 321 of the top metal layer 320. A test portion 333 of second metal layer 330 is disposed beneath top metal layer test portion 323 and test pad 355. A conductive element 334 extending from the test portion 333 of second metal layer 330 through first portion 331 is more easily illustrated with reference to a plan view, as shown in FIG. 4.

Figure 4:
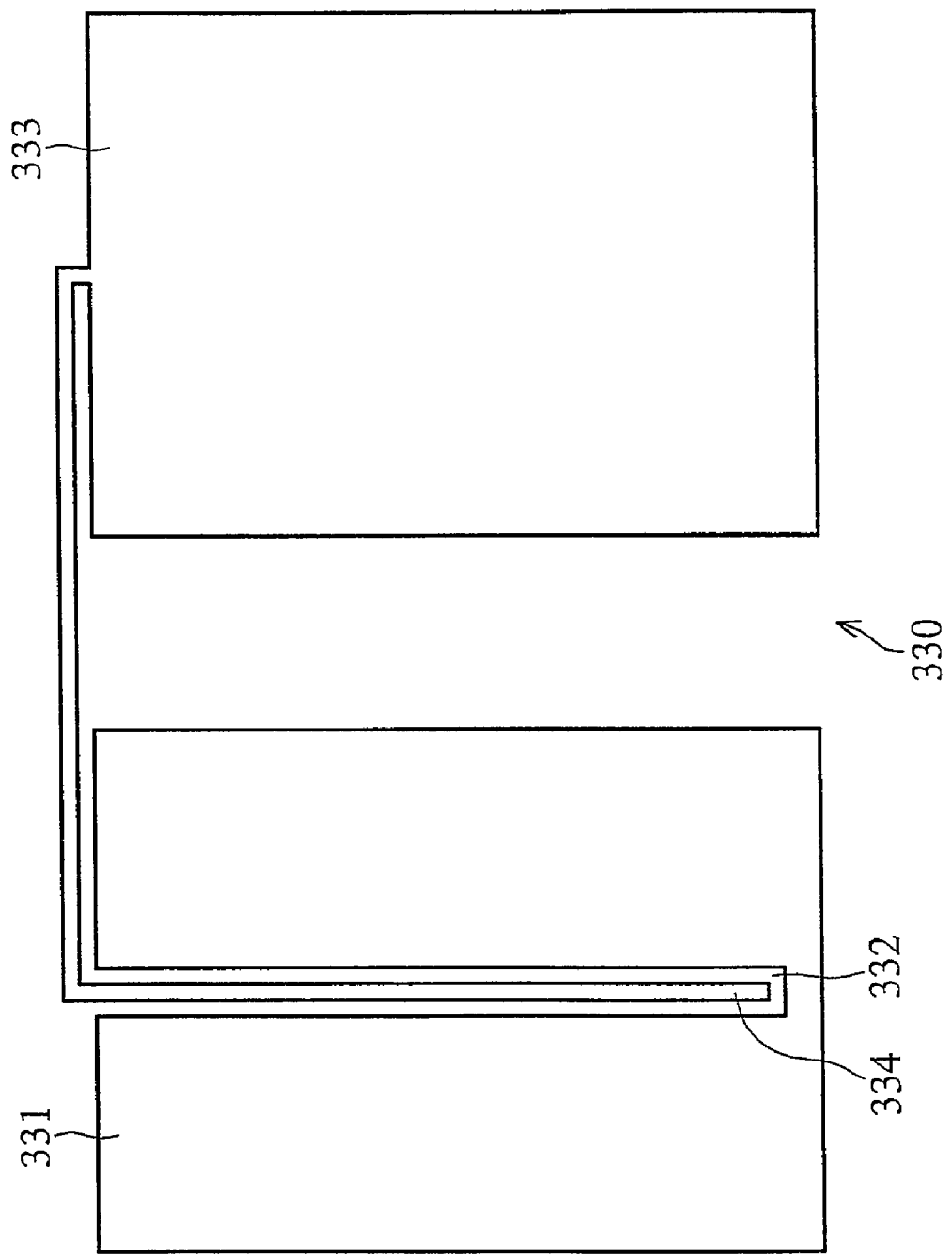
FIG. 4 is a plan view of selected portions of the second metal layer of the semiconductor device of FIG. 3.

FIG. 4 is a plan view of the relevant portions of the second metal layer 330; the relevant portions in this embodiment including first portion 331, test portion 333, and conductive element 334. As can be seen in FIG. 4, first portion 331 forms a recess 332, which in this embodiment is in the shape of a thin, elongated rectangle formed substantially in the middle of the first portion 331, width-wise, and running from one end almost to the other. That is, the recess 332 does not completely separate the two (in this case) halves of first portion 331. As can also be seen in FIG. 3, conductive element 334 is coupled to test portion 333 and extends into recess 332. Conductive element 334, which may be integrally formed with test portion 333, is here also a part of the second metal layer 330. In an alternate embodiment, however, it may be part of another layer as well.

In the embodiment of FIGS. 3 and 4, the recess 332 formed in the first portion 331 of second metal layer 330 is in the shape of an elongated slot running parallel with the length of the first portion 331 (and, in this case, of the test portion 333 as well). The conductive member 334 is a fine metal line that occupies the middle of recess 332 for almost its entire length. This is a presently preferred configuration, adequate to detect vertical shorts without interfering unduly with the other functions of the components involved.

Figure 5A:
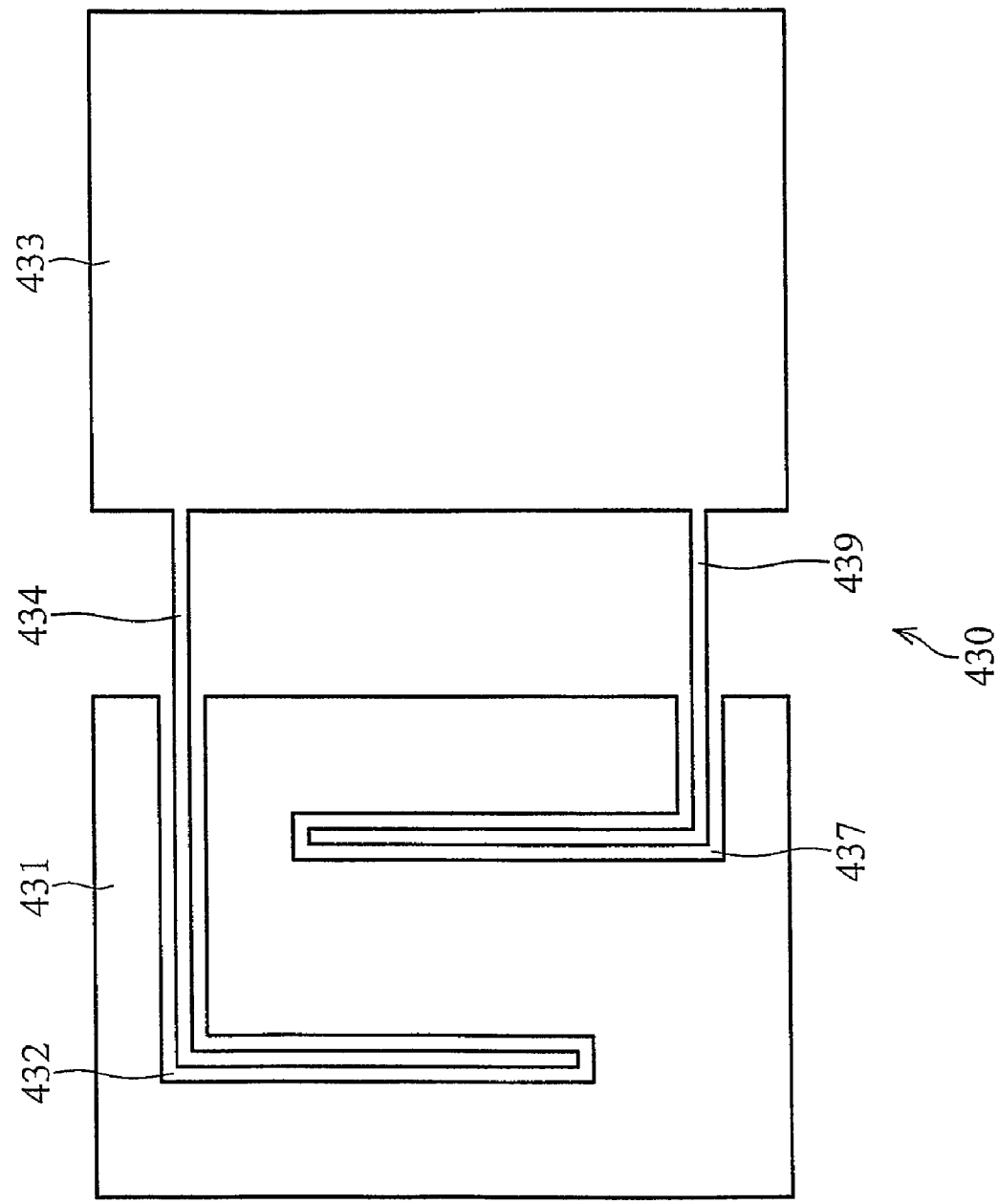
FIGS. 5a through 5c are plan views of selected alternate metal layers for a test structure.
Figure 5B:
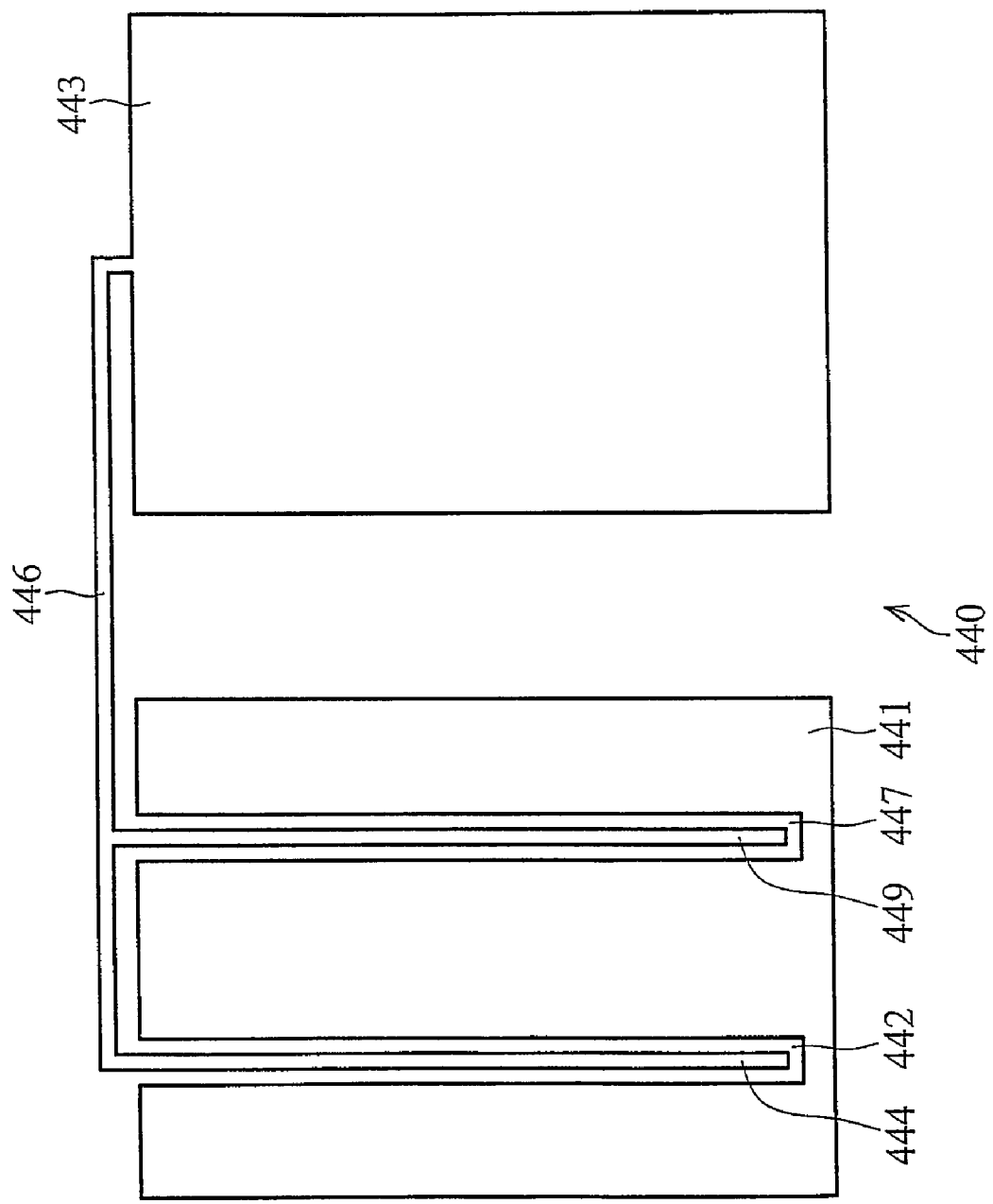
Figure 5C:
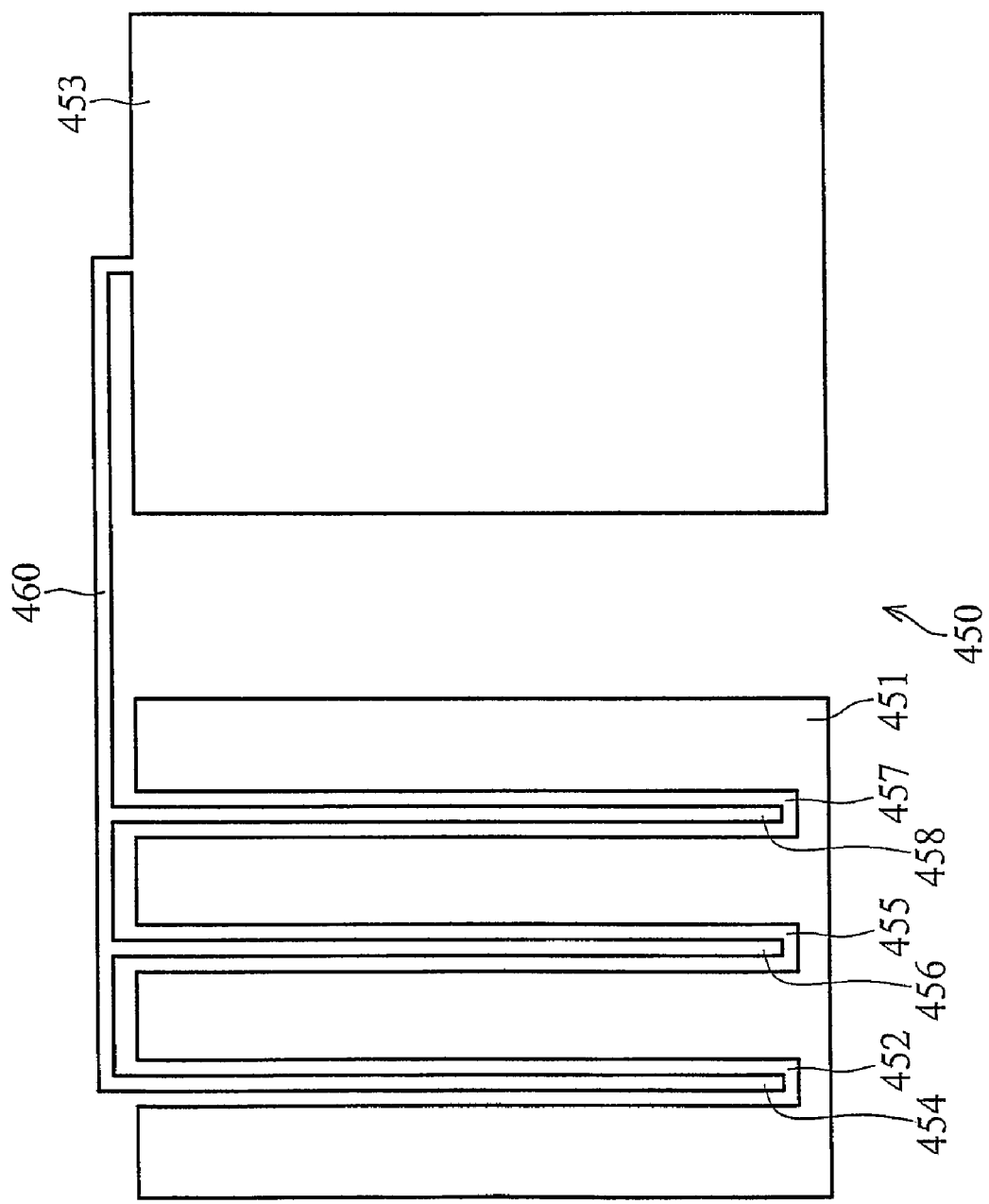

Another configurations are, of course possible. By way of example, FIGS. 5a through 5c are plan views of selected alternate metal layers for a test structure. In the embodiment of FIG. 5a, the first portion 431 of metal layer 430 is, like the first portion 331 of the second metal layer 330 (shown in FIG. 4) about the same size and shape (if slightly smaller) than the pad disposed over it, although this is not a requirement. Unlike first portion 331, however, the first portion 431 of metal layer 430 (shown in FIG. 5) forms two recesses, recess 432 and recess 437. Disposed within recesses 432 and 437 are the ends of conductive members 434 and 439, respectively, which extend from test portion 433 of metal layer 430. Again, these conductive members occupy much of the length of their respective recesses; a configuration preferred but not required. Conductive members, however, do not contact the sides of the recesses in the first portion.

The embodiment of FIG. 5b, two recesses 442 and 447 are likewise formed in first portion 441 of metal layer 440. Unlike the embodiment of FIG. 5a, however, these recesses are substantially straight and include no turns or curves. Conductive member 446 extends from test portion 443 of metal layer 440 and includes two sub-members. Sub-member 444 extends into and for most of the length of recess 442, and sub-member 449 similarly extends into recess 447. Note that while recesses are located at approximately one-quarter and three-quarters of the width of first portion 441, however, this spacing is not required. Nor is the number of sub-members limited to two. In the embodiment of FIG. 5c, for example, three recesses 452, 455, and 457 are formed in first portion 451 of metal layer 450. Correspondingly, conductive member 460 extending from test portion 453 includes sub-members 454, 456, and 458 that extend into recesses 452, 455, and 457, respectively. Again, although the three recesses of this embodiment are parallel and regularly spaced, this is not a requirement of the invention.

In the embodiment of FIGS. 3 and 4, as in the embodiments of FIG. 5a through 5c (which are not shown in cross-section), one key is the proper coverage of the metal layer first portion area by the conductive members, while interfering as little as possible with operation of the overall device. Although the embodiments of FIGS. 5a through 5c are not presently preferred, they may each be advantageous in certain applications. Other embodiments are, of course, possible, and different conductive member configurations may be of advantage in different applications.

Figure 6:
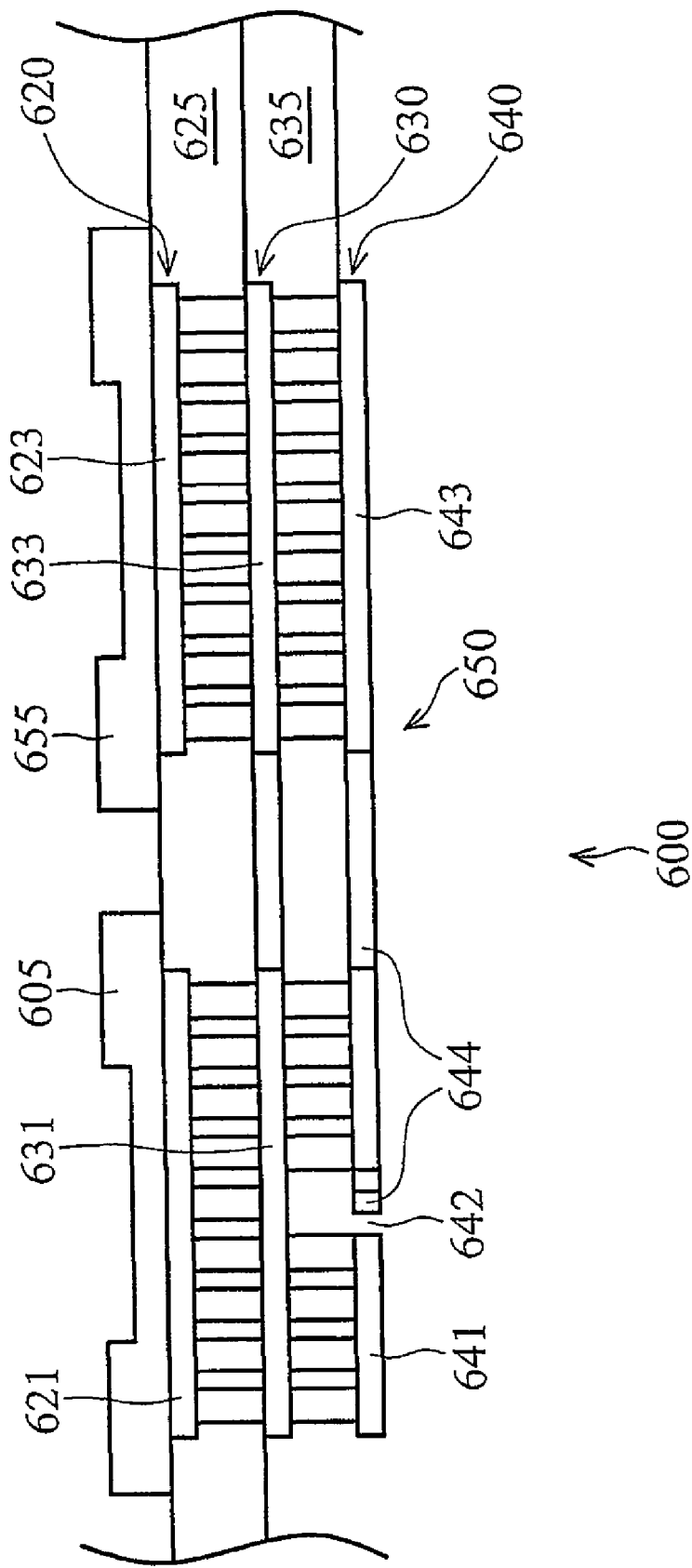
FIG. 6 is a cross-sectional view of a semiconductor device according to an alternative embodiment of the present invention.
Figure 7:
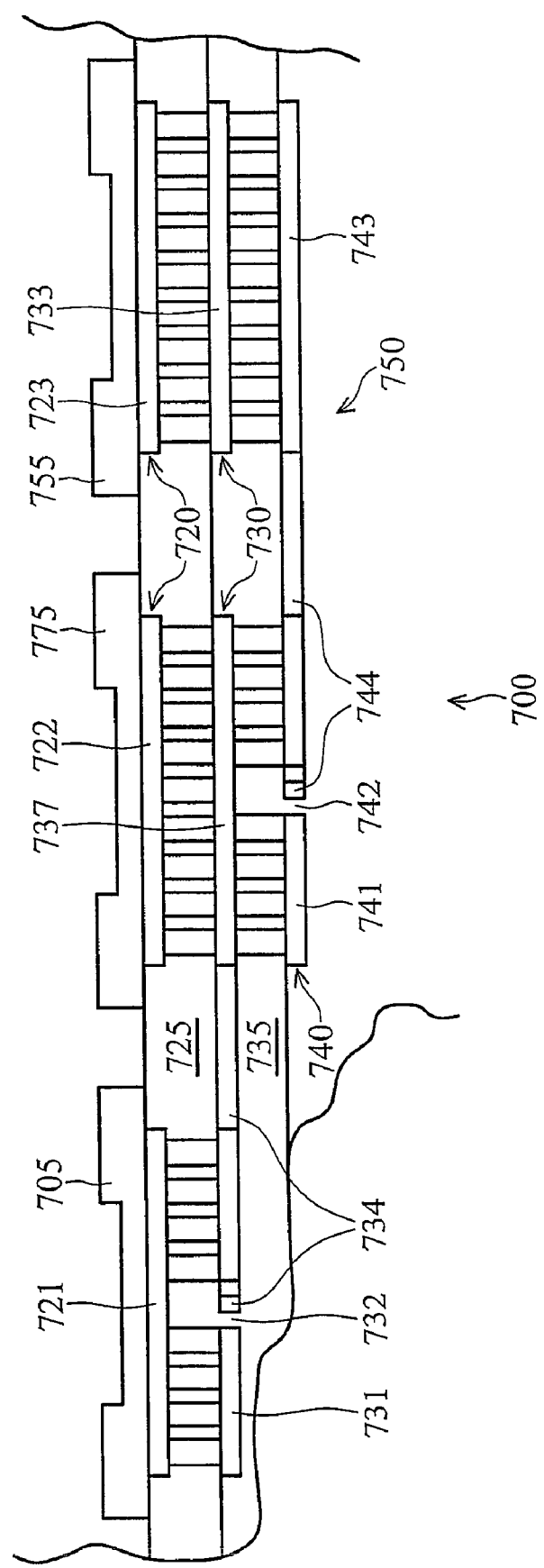
FIG. 7 is a cross-sectional view of a semiconductor device according to another alternate embodiment of the present invention.
Figure 8:
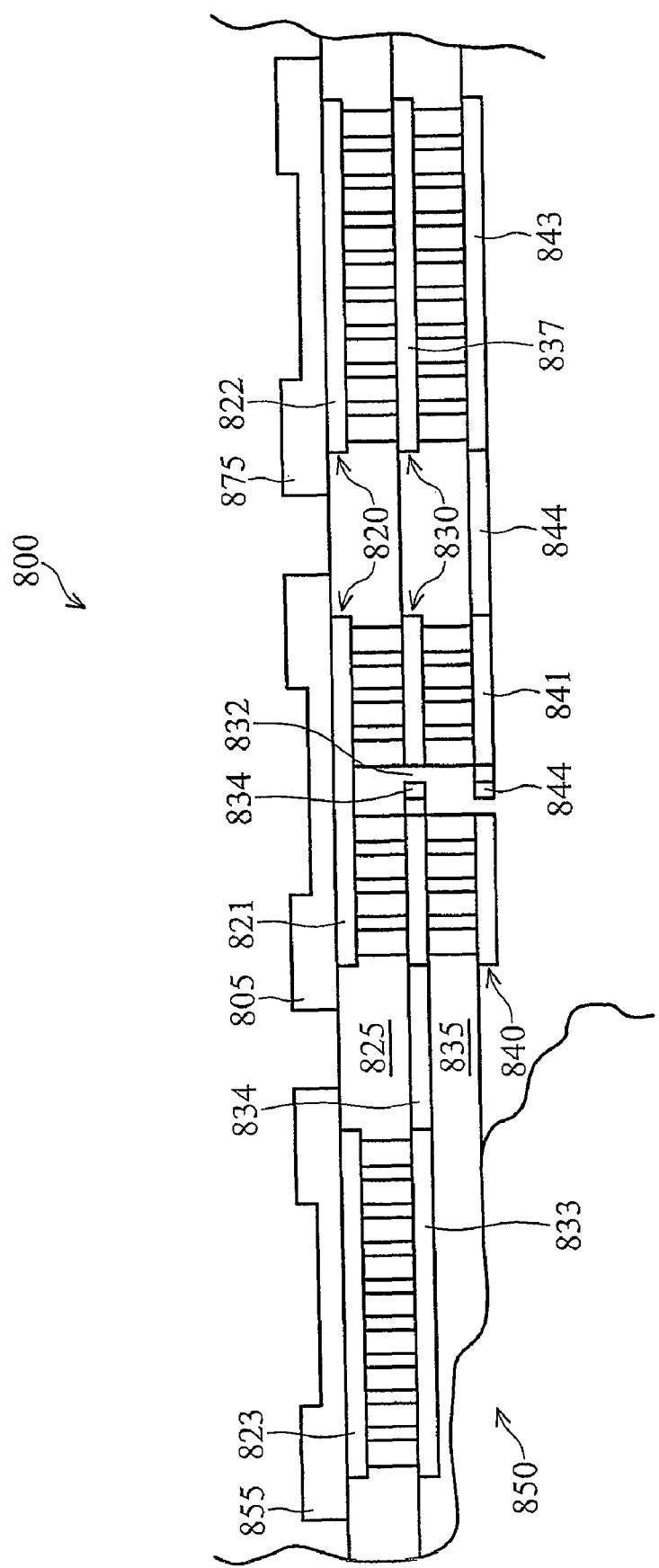
FIG. 8 is a cross-sectional view of a semiconductor device according to another alternate embodiment of the present invention.

In the embodiment of FIG. 3 the second metal layer 330 is separated from pads 305 and 355 by IMD layer 325 and top metal layer 320. This arrangement may be varied as well, as illustrated by the examples of FIGS. 6 through 8. FIG. 6 is a side view of a semiconductor device 600 according to an alternative embodiment of the present induction. In this embodiment, the test structure 650 is integrated into the semiconductor device 600 at different metal layer. Similar to previously-described embodiments, the pad 605 and test pad 655 are disposed at the top of semiconductor device 600 and have an exposed surface or at least can be connected with by an external test device. Again, they are preferably located relatively closely together though they are electronically-isolated from each other.

Below and coupled with pad 605 and test pad 655 is top metal layer 620, divided into two portions, first portion 621 and second portion 623, each lying below a respective one of the pads. Disposed below top metal layer 620 and separated from is by IMD layer 625 is a second metal layer 630, also separated in FIG. 6 into two portions, here referred to as 631 and 633, respectively. In this embodiment, first portion 631 and second portion 633 of second metal layer are simply operational layers for establishing electrical connections. Second metal layer 630 is disposed above a second IMD layer 635, which is in turn disposed above third metal layer 640. As with previously described embodiments, IMD layer 625 and IMD layer 635 form conductor-filled vias as necessary to make the proper connections between metal layers.

Third metal layer 640 is, in the embodiment of FIG. 6, configured as part of the test structure 650 for semiconductor device 600. Here, its configuration is essentially the same as that of second metal layer 330 shown in FIGS. 3 and 4. In an alternate embodiment, the third metal layer of device 600 may be configured similarly to the metal layer 430 of FIG. 5, or use some other arrangement of conductive members. In the embodiment of FIG. 6, the third metal layer includes a first portion 641 and a test portion 643. A conductive element 644 extends from test portion 643 into a recess 642 formed in first portion 641. As should be apparent, this configuration may be used to detect vertical shorts within the semiconductor device 600, especially those occurring in the second IMD layer 635.

FIG. 7 is a side view of a semiconductor device 700 according to another alternate embodiment of the present invention. In this embodiment, the test structure 750 is integrated into the semiconductor device 700 at two different metal layers, second metal layer 730 and third metal layer 740. In this embodiment, second pad 775 also operates as a test pad for the structure associated with first pad 705. Test pad 755 functions as a test pad with respect to the structure associated with second pad 755. Top metal layer 720 includes a first portion 721, a second portion 722, and a third portion 723, which underlie and are in contact with pads 705, 775, and 755, respectively. IMD layer 725 separates top metal layer 720 from the second metal layer 730. Vias formed in IMD layer 725 are filled with a conductive material to establish any necessary connections between conductive elements of top metal layer 720 and second metal layer 730.

In the embodiment of FIG. 7, second metal layer includes a first portion 731, a second portion 733 and a first test portion 737. The first portion 731 of second metal layer 730 underlies pad 705, from which it is separated by first IMD layer 725 and the first portion 721 of top metal layer 720. Second metal layer first portion 731 forms a recess 732, into which extends a conductive member 734. At its other end, conductive member 734 is connected to the first test portion 737 of second metal layer 730. As can be seen in FIG. 7, first test portion 737 underlies pad 755. Underlying first test portion 737 of second metal layer 730 is a second IMD layer 735 and, beneath the second IMD layer, a first portion 741 of third metal layer 740. In this embodiment, third metal portion 740 includes first portion 741, second test portion 743, and a conductive member 744. Conductive member 744 extends from second test portion 743 into a recess 742 formed in the first portion 741 of third metal layer 740. Note, however, that while both levels of the test structure 750 of semiconductor device 700 have a configuration similar to that illustrated by FIGS. 3 and 4, it is not necessary that they are the same. In alternate embodiments (not shown) the test structure elements in the second metal layer 730 and the third metal layer 740 may instead use configurations that are different from each other.

FIG. 8 is a side view of a semiconductor device 800 according to another alternate embodiment of the present invention. In this embodiment, the test structure 850 is, as with the embodiment of FIG. 7, integrated into two metal layers, here second metal layer 830 and third metal layer 840. As can be seen in FIG. 8, first test pad 855 and second test pad 875 both operate as a test pad for the structure associated with first pad 805. Top metal layer 820 includes a first portion 821, a second portion 822, and a third portion 823, which underlie and are in contact with pads 805, 875, and 855, respectively. IMD layer 825 separates top metal layer 820 from the second metal layer 830. Vias formed in IMD layer 825 are filled with a conductive material to establish any necessary connections between conductive elements of top metal layer 820 and second metal layer 830.

In the embodiment of FIG. 8, second metal layer includes a first portion 831, a second portion 837 underlying pad 875, and a first test portion 833 underlying pad 855. The first portion 831 of second metal layer 830 underlies pad 805, from which it is separated by first IMD layer 825 and the first portion 821 of top metal layer 820. First portion 831 forms a recess 832, into which extends a conductive member 834. Conductive member 834, also an element of the second metal layer 830, is connected to first test portion 833. In an alternate embodiment (not shown) it could also be connected, for example using a via, to a test portion that is an element of a different metal layer. Returning to the embodiment of FIG. 8, third metal layer 840 is separated from second metal layer 830 by a second IMD layer 835. In this embodiment, third metal layer 840 includes a first portion 841, which underlies pad 805. First portion 841 forms a recess 842, into which extends a conductive member 844. Conductive member 844 is connected to second test portion 843, which is a portion of third metal layer 840 and underlies pad 875.

Although the present invention and its advantages have been described in detail, it should be understood that various changes, substitutions and alterations can be made herein without departing from the spirit and scope of the invention as defined by the appended claims. For example, it should be apparent that the test structure integrated into a semiconductor device may be implemented on any layer or on a combination of layers. The test portions of any metal layer may have one or any practical number of conductive members extending form them, and the recesses receiving these conductive members may be configured in a variety of patterns. And the components designated or used as test components may, of course, have operational functions as well.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A test structure for integration into a semiconductor device having a pad separated from an active area by a plurality of metal layers, said test structure comprising:
   a test pad;
   a conductive test portion disposed under the test pad; and
   at least one conductive member, said conductive member extending from the conductive test portion into a recess formed in a portion of one metal layer of the plurality of metal layers, the recess-forming portion being disposed under the pad and electrically-isolated from the conductive test portion.

2. The test structure of claim 1, wherein the conductive test portion is an element of the same metal layer as the recess-forming portion.

3. The test structure of claim 1, wherein the conductive test portion is an element of a different metal layer than the recess-forming portion, the metal layer and the different metal layer separated by at least one inter-metal dielectric (IMD) layer.

4. The test structure of claim 3, wherein the conductive member comprises at least one via filled with a conductive material.

5. The test structure of claim 1, further comprising a top metal layer having a first portion coupled to the pad and a second portion coupled to the test pad.

6. The test structure of claim 1, further comprising a second conductive member extending from the conductive test portion into a recess formed in a second portion of one metal layer of the plurality of metal layers.

7. The test structure of claim 6, wherein the first portion and the second portion are elements of the same metal layer.

8. The test structure of claim 1, further comprising a second conductive test portion and a second conductive member extending from the second conductive test portion.

9. The test structure of claim 8, wherein the first conductive test portion and the second conductive test portion are elements of different metal layers of the plurality of metal layers.

10. A test structure comprising:
    a test contact pad; and
    a conductive feature formed under the test contact pad, the conductive feature including an extension element, the extension element extending into a slot formed in a second conductive feature formed under a device contact pad.

11. The test structure of claim 10 further comprising a redistribution layer feature interjacent the test contact pad and the conductive feature.

12. The test structure of claim 10 wherein the extension element includes a first and second sub-element, each of which extends into a respective slot in the second conductive feature.

13. The test structure of claim 10 further comprising:
    a second test contact pad; and
    a third conductive feature formed under the test second contact pad, the third conductive feature including a second extension element, the second extension element extending to beneath the device contact pad.

14. The test structure of claim 13 wherein the conductive feature and the third conductive feature are formed in a common metal interconnect layer.

15. A test structure comprising:
a first test pad;
a first test conductor underlying the first test pad and electrically connected thereto by a first via; and
a first extension feature electrically connected to the first test conductor and extending into a slot in a first device conductor, the first device conductor being under a first device pad and electrically connected thereto by a second via.

16. The test structure of claim 15 further comprising:
a second extension feature electrically connected to the first test conductor and extending into a second slot in the first device conductor.

17. The test structure of claim 15 wherein the first extension feature comprises an elongated rectangle.

18. The test structure of claim 15 further comprising:
a second test pad;
a second test conductor underlying the second test pad and electrically connected thereto by a third via; and
another extension feature electrically connected to the second test conductor and extending into slot in a second device conductor, the second device conductor being formed under the first device pad and electrically connected thereto.

19. The test structure of claim 18 wherein the test structure includes conductors formed in multiple conductor layers and wherein the first and second test conductors are located in different respective conductive layers.

* * * * *

UNITED STATES PATENT AND TRADEMARK OFFICE
CERTIFICATE OF CORRECTION

| | | |
|---|---|---|
| PATENT NO. | : 7,939,824 B2 | Page 1 of 1 |
| APPLICATION NO. | : 12/354338 | |
| DATED | : May 10, 2011 | |
| INVENTOR(S) | : Peng et al. | |

It is certified that error appears in the above-identified patent and that said Letters Patent is hereby corrected as shown below:

In Col. 10, line 61, claim 13, delete "test second" and insert --second test--.

In Col. 12, line 6, claim 18, after "extending into" insert --a--.

Signed and Sealed this
Twelfth Day of July, 2011

David J. Kappos
*Director of the United States Patent and Trademark Office*